US005307418A

United States Patent [19]

Sumitani

[11] Patent Number: 5,307,418

[45] Date of Patent: Apr. 26, 1994

[54] CENTER CHANNEL SPEAKER HAVING MULTIPLE INTERCONNECTED BACKLOAD AMPLIFYING CHAMBERS FOR SURROUND SOUND STEREO AUDIO SYSTEMS

[75] Inventor: Yoichiro Sumitani, Rancho Palos Verdes, Calif.

[73] Assignee: Culver Electronic Sales, Inc., Gardena, Calif.

[21] Appl. No.: 969,389

[22] Filed: Oct. 30, 1992

[51] Int. Cl.[5] ....................... H04R 25/00; H04R 5/00; H05K 5/00; A47B 81/06

[52] U.S. Cl. ....................................... 381/159; 381/24; 381/27; 181/145; 181/147; 181/199

[58] Field of Search ............... 381/153, 154, 156, 159, 381/24, 27, 1; 181/145, 147, 156, 148, 160, 182, 199, 198, 189

[56] References Cited

U.S. PATENT DOCUMENTS

| | | | |
|---|---|---|---|
| 4,628,528 | 12/1986 | Bose et al. | 381/154 |
| 5,092,424 | 3/1992 | Schreiber et al. | 181/145 |
| 5,197,099 | 3/1993 | Hirasawa | 381/27 |
| 5,222,145 | 6/1993 | Draffen | 381/24 |

*Primary Examiner*—Curtis Kuntz
*Assistant Examiner*—D. W. Lee
*Attorney, Agent, or Firm*—Thomas I. Rozsa; Tony D. Chen

[57] ABSTRACT

The present invention is a multi-chamber two-way center channel speaker for an audio system which has four stereo surround sound channels including a right front channel, a left front channel, a rear surround channel and a center channel. The preferred embodiment of the present invention center channel speaker comprises a VCR shaped cabinet having three parallel interior chambers including a front chamber, a middle and a rear chamber, all interconnected by offset openings. A tweeter and two midranges are installed in the front chamber. The rear chamber is vented through a rear opening. The volumes of the three chambers are expanded. This design and construction makes the three interconnected chambers a bass-reflex enclosure having gradually expanded volume for amplifying the backload of the two midranges. Therefore while the tweeter and the two midranges produce high and mid-frequency center channel dialogue sound effects of the audio system, the interconnected front, middle and rear chambers amplify the backload of the midranges to produce deep, rich, open and airy center channel sound effects of the audio system.

21 Claims, 3 Drawing Sheets

(Section on line 5 - 5)

(Section on line 6 - 6)

(Section on line 7 - 7)

FIG.8
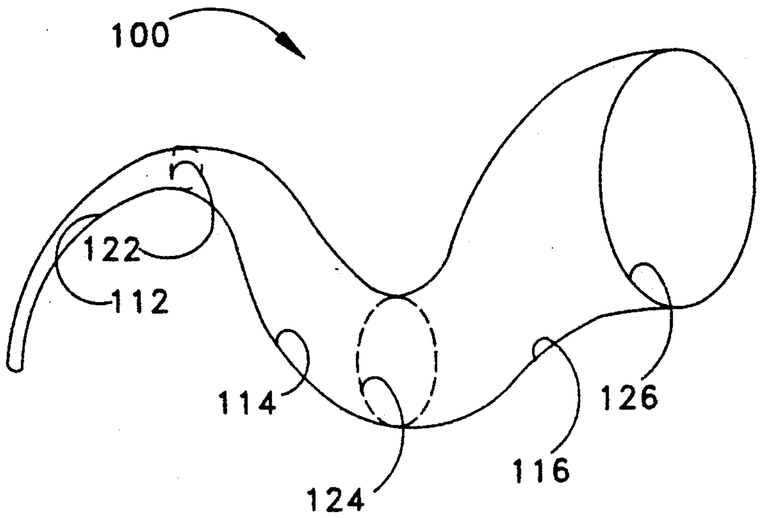
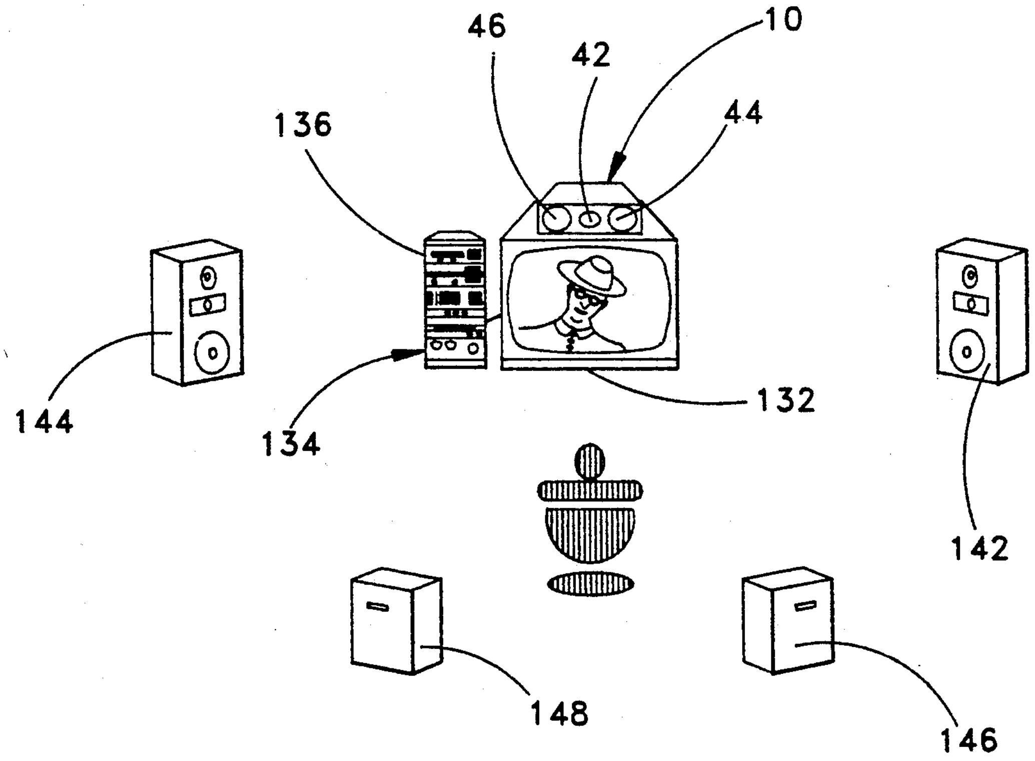
FIG.9

CENTER CHANNEL SPEAKER HAVING MULTIPLE INTERCONNECTED BACKLOAD AMPLIFYING CHAMBERS FOR SURROUND SOUND STEREO AUDIO SYSTEMS

BACKGROUND OF THE INVENTION

1. Field of the Invention

The present invention relates to the field of electronic audio/video home entertainment systems. More particularly, the present invention relates to the field of speaker system arrangements for stereo surround sound audio systems.

2. Description of the Prior Art

Home electronic audio/video entertainment systems have become very popular today. Many people have installed complete audio/video systems at their own homes to make so called "home theaters" for enjoying individualized entertainment.

A "home theater" entertainment system typically includes a large screen or projection television (TV) set, a multiplicity of audio/video components and a speaker system. The multiplicity of audio/video components may comprise an audio/video receiver which serves as the control center of all other audio and video components of the entire audio/video system. The audio components may include a compact disc (CD) player, a cassette tape recorder/player, a digital audio tape (DAT) recorder/player, and a turntable. The video components may include a video cassette recorder (VCR) and a laser disc (LD) player.

The speaker system of the home theater system typically includes a right front speaker, a left front speaker and two rear speakers. The term "speaker" used throughout this application does not refer to a single loudspeaker, but rather to a unit of loudspeakers. A "speaker" used in this sense generally comprises three basic parts. The first part includes one or more loudspeaker drivers, such as a "tweeter" which reproduces high frequency sounds, a "midrange" which reproduces mid-frequency sounds, and a "subwoofer" which reproduces low frequency sounds. The second part includes a crossover network which divides the input frequencies into two or more bands for their appropriate drivers. The third part is an acoustic cabinet which houses the loudspeaker drivers. If a driver is mounted at the front side of the cabinet, it is a "frontfiring" driver.

Therefore, in this application the term "speaker" refers to the complete unit including the independent cabinet, in which one or more drivers and crossover networks are installed. The term "driver" then refers to the single loudspeaker driver such as a tweeter, a midrange, a full-range, a woofer and a subwoofer.

For example, a traditional "3-way" speaker has three drivers mounted inside a rectangular box-shaped cabinet. The three drivers may be a tweeter, a midrange or a full range, and a subwoofer or woofer. The physical dimensions of the drivers are often measured by the diameters of their respective diaphragms. For example, in many home entertainment systems, the sizes of tweeters may be between ½ and 2 inches, the sizes of midranges or full ranges may be between 3½ and 6 inches, and the sizes of subwoofers or woofers may be between 6 and 10 inches.

An important aspect of the high and mid-frequency drivers is that they are directional drivers, which means that they must be placed in the direction of the listener. Low frequency drivers are non-directional and may be placed anywhere without reducing their sound qualities. This is because the wavelength of low frequency sound waves are much longer and less likely to encounter interference by furniture or other objects.

Early home stereo systems reproduced a stereo sound effect through two separate channels: a right front channel and a left front channel. The advanced high fidelity (HiFi) home stereo systems now typically reproduce a surround sound effect in four separate channels. Two more channels are provided in addition to the right and left front channels, including a rear surround channel and a center channel. The rear surround channel is used primarily for time-delay surround effect, and the center channel is used primarily for on-screen dialogues. The term "dialogue" is used in the art to describe primarily the sound of human voices such as news announcement, conversations and singing. It may also include other sounds in the same frequency range. Almost all CDs, LDs and DAT music tapes, most VCR movie tapes and audio cassette music tapes, and many TV and radio programs broadcast on network or cable systems are now encoded with all four channels.

In a typical speaker system, the right front speaker is connected to the right front channel of a receiver (or amplifier), the left front speaker is connected to the left front channel of the receiver, and the two rear speakers 26 are connected to the rear surround channel of the receiver. However, the speaker systems of conventional home entertainment systems usually do not have a center channel speaker. Center channel speakers are desirable because they produce much clearer sound effect for dialogue, and deliver more realistic sound effects because the sound is coming from the center where the TV set is placed and from which the sound of dialogue is supposed to emanate.

Prior art inventions have attempted to solve this problem in two basic ways. The first attempt to solve this problem was to use the built-in speaker of the TV set, provided that input terminals for its built-in speaker are incorporated into the TV set. The second way to solve this problem was to use the so-called "phantom" mode available on some models of the receivers. In such "phantom" mode the signal of the center channel is sent to the two front speakers. The two front speakers then reproduce synthesized sound for the non-existing center channel speaker.

It is more desirable today to use independent and separate real center channel speakers because the speakers built into the TV sets usually produce less effective sound effects than separate speakers, and the quality of the synthesized "phantom" sound produced by the front speakers cannot be as good as the quality of the real sound produced by a real center channel speaker. Therefore, it will be very beneficial to design and manufacture an independent center channel speaker which is able to produce high quality sound effects of the center channel of the HiFi surround sound stereo audio systems.

SUMMARY OF THE INVENTION

The present invention is a front-firing two-way center channel speaker having multiple interconnected backload amplifying chambers for producing high quality center channel sound effects of the HiFi surround sound stereo audio systems.

It is known that an advanced surround sound stereo audio system should be able to produce surround sound effects through four separate channels: two front channels, a rear surround channel and a center channel. The conventional surround sound stereo audio systems usually only have front speakers for front channels and rear speakers for rear surround channel, but no speaker for the center channel. However, using a separate center channel speaker can provide the best results in reproducing the sound effects of the center channel.

It has been discovered, according to the present invention, that since the primary function of a center channel speaker is to produce the sound effect of dialogue which is supposed to come from the TV set, the location, dimension and configuration of the center channel speaker are very limited. The center channel speaker must have high and mid-frequency drivers such as tweeters and midranges for properly producing the sound effects of people's dialogue. Since the high and mid-frequency drivers are directional drivers, the center channel speaker must be placed together with the TV set and its high and mid-frequency drivers must be front-firing.

It has also been discovered, according to the present invention, that in most home entertainment systems, there is a space available either above or beneath the TV set which is large enough to place an audio/video component of standard exterior dimensions. For example, most large screen or projection TV sets have a large flat top surface. Smaller TV sets usually do not have a large top surface, but they are often placed on the shelf of a cabinet or cart, where there is another shelf above or beneath the TV set available for placing standard audio/video component. The standard exterior dimensions of most home entertainment audio/video components are approximately 17 to 18 inches in width, approximately 4 to 5 inches in height and approximately 17 to 18 inches in depth.

It has further been discovered, according to the present invention, that it is most cost-efficient to build only high and mid-frequency drivers such as tweeter and midrange in the center channel speaker, without additional low-frequency drivers such as woofer and subwoofer, because the primary function of the center channel speaker is to produce sound effects of people's dialogue which fall within high and mid-frequency ranges. However, it is still highly desirable to compensate and enrich the lower frequency dialogue sound effects of the mid-frequency drivers, so that the total sound effects of the center channel speakers is smooth, seamless and airy. The term "airy" is used in the art to describe generally the open, resonating and resounding effects of mid and low frequency drivers.

It is therefore an object of the present invention to provide a center channel speaker to produce high quality center channel sound effects as part of the complete HiFi surround sound effects for people's home entertainment audio/video systems.

It is also an object of the present invention to provide a center channel speaker which is designed to be placed together with the TV set and which has standard exterior dimensions similar to other standard audio/video components such as VCRs.

It is another object of the present invention to provide a center channel speaker which has front-firing high and mid-frequency drivers such as tweeter and midranges.

It is a further object of the present invention to provide a center channel speaker for the speaker systems of people's home entertainment audio/video systems, where the center channel speaker is able to produce not only high quality high and mid-frequency dialogue and other sound effects, but also deep, rich and airy lower frequency dialogue and other sound effects.

It is an additional object of the present invention to provide low cost center channel speakers for the speaker systems of people's home entertainment audio/video systems.

Described generally, the present invention is a front-firing two-way center channel speaker having multiple interconnected backload amplifying chambers. In a preferred embodiment of the present invention, the cabinet of the center channel speaker has the same standard exterior dimensions as standard VCRs. The cabinet of the present invention center speaker further has a multiplicity of interior chambers, including a front chamber for installing the drivers. The center channel speaker has a multiplicity of high and mid-frequency drivers for producing the dialogue and other sound effects. These high and mid-frequency drivers are installed in the front chamber of the speaker so that they are front-firing.

The most important and unique feature of the present invention center channel speaker is the interior design and construction of its chambers. The interior chambers of the present invention center channel speaker are not equally sized. The front-most chamber is the smallest, the rear-most chamber is the largest, and the sizes of the chambers inbetween are gradually increased. There is an opening provided on each partition wall which divides two adjacent chambers, so that all chambers are interconnected. However, the openings on the partition walls are offset, and the sizes of the openings are also gradually increased from the front chamber to the rear chamber. The rear-most chamber also has an outlet opening. Therefore, the interconnected chambers altogether form a vented enclosure having an increased volume, which is similar to the interior chamber of a horn, to amplify the backload of the mid-frequency drivers. Accordingly, the present invention center channel speaker is able to produce not only excellent high and mid-frequency dialogue sound effects, but also rich and airy lower frequency dialogue sound effects.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 8 is an illustrative diagram of the gradually expanded interior chamber of a horn.

FIG. 9 is a perspective view of a typical arrangement of a home theater audio/video entertainment system, utilizing the present invention center channel speaker.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
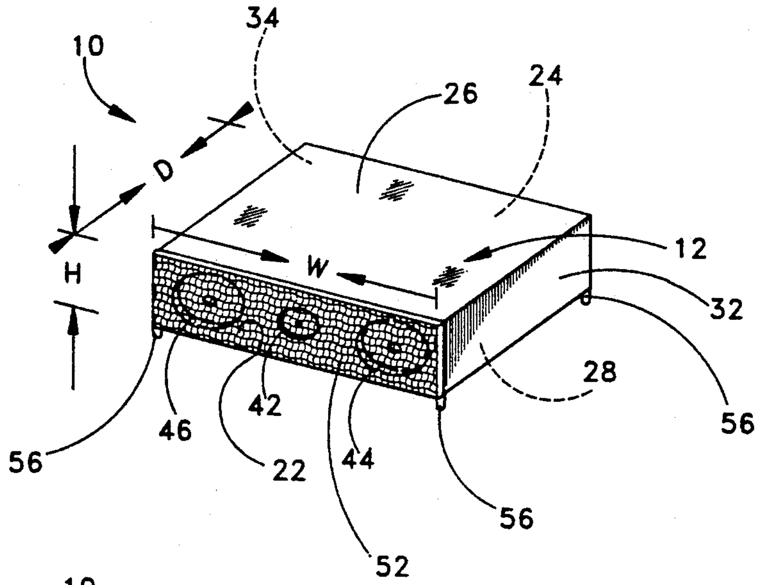
FIG. 1 is a top front perspective view of a preferred embodiment of the present invention center channel speaker.
Figure 2:
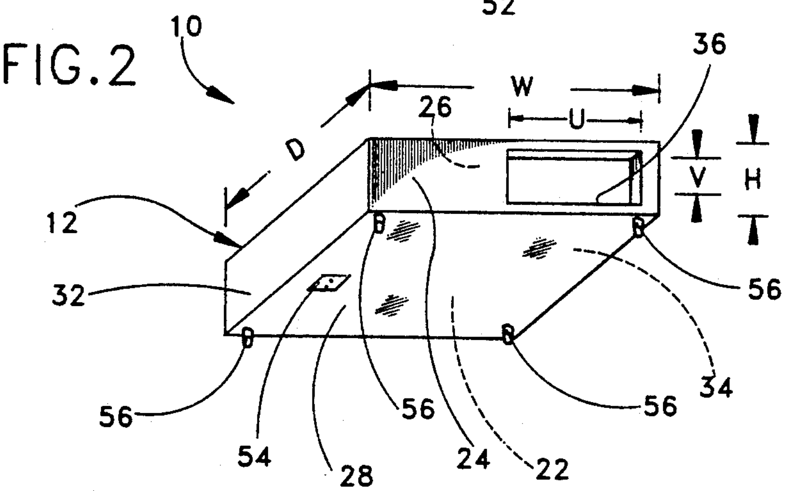
FIG. 2 is a bottom rear perspective view of the preferred embodiment of the present invention center channel speaker.

Referring to FIGS. 1 and 2, there is shown at 10 the perspective view of a preferred embodiment of the present invention center channel speaker for the surround sound speaker systems of home theater audio/video entertainment systems. The present invention center channel speaker 10 has a generally rectangular shaped hollow cabinet 12. The cabinet 12 has a front end 22, a rear end 24, a top 26, a bottom 28 and two opposite sides 32 and 34. There is an opening 36 at the rear end of the cabinet 12 which opens into the hollow interior of the cabinet 10. The center channel speaker 10 also has three front-firing drivers: a tweeter 42, a right midrange 44 and a left midrange 46. The two midranges 44 and 46 may be replaced by two full-range drivers. All three drivers 42, 44 and 46 are installed at the front end 22 of the cabinet 12. A protective grill 52 is attached to the front end 22 of the cabinet 12 after the three drivers 42, 44 and 46 are installed. The center channel speaker 10 further has a crossover network 54. In addition, four stands 56 are also provided on the bottom 28 of the cabinet 12 for elevating and cushioning the speaker. The cabinet 12 of the present invention center channel speaker 10 is preferably made of wooden materials.

The exterior dimensions of the rectangular shaped cabinet 12 of the present invention center channel speaker 10 are generally the same as the standard dimensions of other audio/video components such as VCRs. For example, in the preferred embodiment of the present invention, the width "W" of the cabinet 12 is approximately 17 inches, the height "H" of the cabinet 12 is approximately 5 inches, and the depth "D" of the cabinet 12 is approximately 18 inches. The width "U" of the rear opening 36 is approximately 8.8 inches and the height "V" of the rear opening 36 is approximately 3.28 inches.

Figure 3:
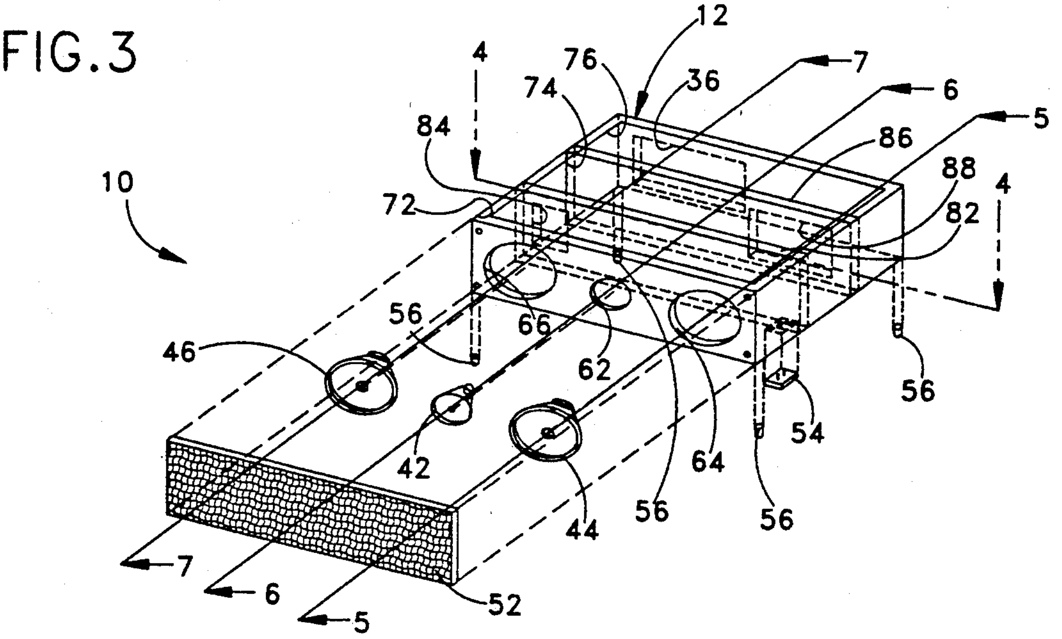
FIG. 3 is an exploded view of the preferred embodiment of the present invention center channel speaker.
Figure 4:
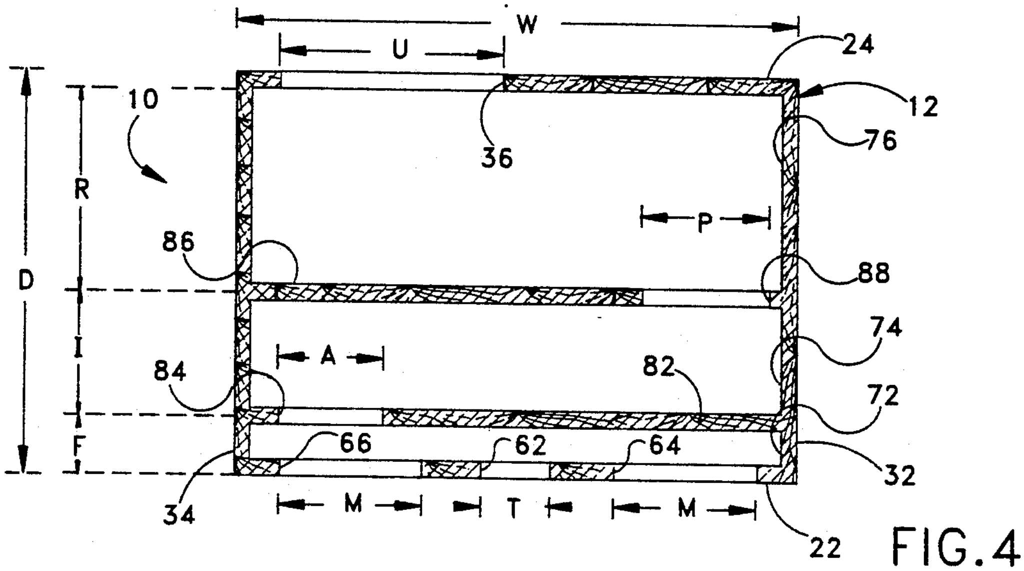
FIG. 4 is a top cross-sectional view of the preferred embodiment of the present invention center channel speaker taken along line 4—4 of FIG. 3.
Figure 5:
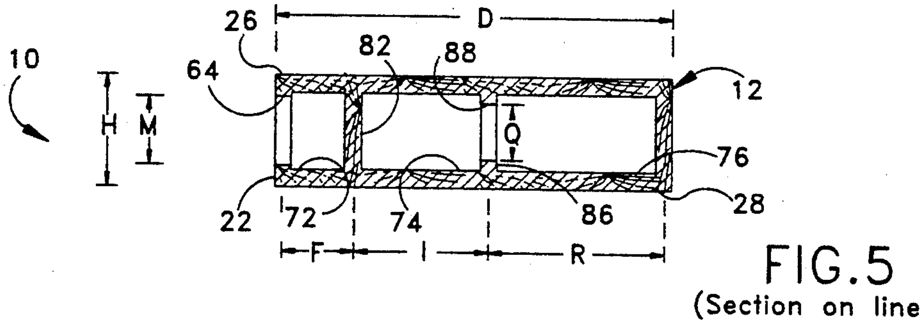
FIG. 5 is a side cross-sectional view of the preferred embodiment of the present invention center channel speaker taken along line 5—5 of FIG. 3.
Figure 6:
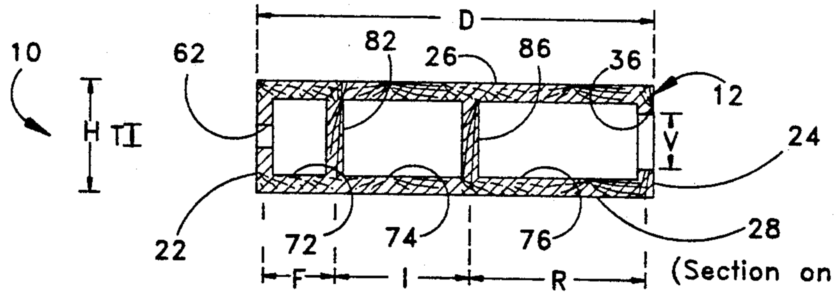
FIG. 6 is also a side cross-sectional view of the preferred embodiment of the present invention center channel speaker taken along line 6—6 of FIG. 3.
Figure 7:
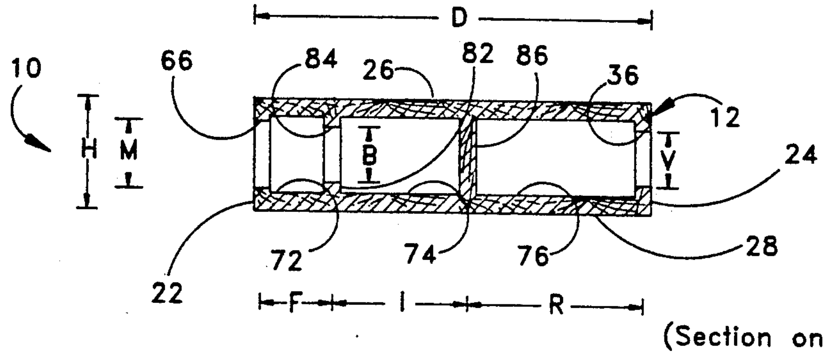
FIG. 7 is another side cross-sectional view of the preferred embodiment of the present invention center channel speaker taken along line 7—7 of FIG. 3.

Referring to FIG. 3, there is shown an exploded view of the preferred embodiment of the present invention center channel speaker 10. On the front end 22 of the cabinet 12 there are three openings 62, 64 and 66. The middle opening 62 is smaller because it is made for installing the tweeter 42. The right opening 64 and the left opening 66 are larger because they are made for installing the right midrange 44 and left midrange 46 respectively. The tweeter 42 and the midranges 44 and 46 are attached to the front end 22 of the cabinet 12 by suitable conventional fasteners such as screws. The sizes of these front openings are determined by the sizes of the respective drivers 42, 44 and 46 which are usually measured by the diameters of their diaphragms. For example, if the size of the tweeter 42 is 1 inch, then the diameter "T" of the center opening 62 is approximately 1 inch. Similarly, if the sizes of the right midrange 44 and the left midrange 46 are both 4½ inches, then the diameters "M" of the right and left front openings 64 and 66 are both approximately 4½ inches.

The novelty of the present invention center channel speaker 10 is that the interior of the cabinet 12 is divided into a multiplicity of interconnected chambers for amplifying the backload of the front-firing drivers. In the preferred embodiment of the present invention center channel speaker 10, the multiplicity of interior chambers of the hollow cabinet 12 includes a front chamber 72, a central chamber 74 and a rear chamber 76. The front chamber 72 and the central chamber 74 are divided by a first partition wall 82 and interconnected through a first interconnecting opening 84 on the first partition wall 82. The central chamber 74 and the rear chamber 76 are divided by a second partition wall 86 and interconnected through a second interconnecting opening 88 on the second partition wall 86.

The unique features of the present invention center channel speaker 10 are further illustrated in FIGS. 4 through 7, where various cross-sectional views of the cabinet 12 of the present invention center channel speaker 10 are shown. One unique feature of the present invention center channel speaker 10 is that the volumes of the interior chambers 72, 74 and 76 are gradually increased. In the preferred embodiment of the present invention, all three interior chambers 72, 74 and 76 have the same width of approximately 17 inches which is equal to the width "W" of the cabinet 12, and the same height of approximately 5 inches which is equal to the height "H" of the cabinet 12. However, their respective depths are different. The depth "F" of the front chamber 72 is approximately 3 inches, the depth "I" of the central chamber 74 is approximately 6 inches, and the depth "R" of the rear chamber 76 is approximately 9 inches. Therefore the volume ratio of the three interior chambers 72, 74 and 76 is approximately 1:2:3. Of course other suitable ratios may be incorporated into the various embodiments of the present invention.

Another unique feature of the present invention center channel speaker 10 is that all openings, including the rear opening 36 and the first and second interconnecting openings 84 and 88 which interconnect the multiple interior chambers 72, 74 and 76, are offset alternatively. For example, the second interconnecting opening 88 on the second partition wall 86 is offset from rear opening 36 at the rear end 24 of the cabinet 12, and the first interconnecting opening 84 on the first partition wall 82 is offset from the second interconnecting opening 88 on the second partition wall 86. Because of this alternative offset feature, the sound waves generated by the diaphragms of the drivers 42, 44 and 46 in the front chamber 72 will not directly be vented into the rear chamber 76. Instead the sound waves have to travel through the central chamber 74.

A further unique feature of the present invention is that the sizes of the openings, including the rear opening 36 and the first and second interconnecting openings 84 and 88, are gradually increased. In the preferred embodiment of the present invention, the height "B" of the first interconnecting openings 84, the height "Q" of the second interconnecting opening 88 and the height "V" of the rear opening 36 are all approximately 3.28 inches. However, the widths of the first and second interconnecting openings 84 and 88 and the rear opening 36 are gradually increased. The width "A" of the first interconnecting opening 84 is approximately 2 inches, the width "P" of the second interconnecting opening 88 is approximately 5.43 inches, and the width "U" of the rear opening 36 is approximately 8.8 inches. Of course other suitable sizes may be incorporated into the various embodiments of the present invention.

The multiple interconnected chambers 72, 74 and 76 of the present invention center channel speaker 10 are designed and constructed with all these unique features to assemble an amplifying chamber for the backload of the midranges 44 and 46, where the backload amplifying chamber closely resembles the interior chamber of a horn type musical instrument. Referring to FIG. 8, there is shown at 100 an analogy of an interior chamber of a horn type musical instrument. The three interconnected chambers 72, 74 and 76 of the present invention speaker 10 are analogous to the widened portions 112, 114 and 116 of the interior chamber of the horn type musical instrument 100, the two interconnecting openings 84 and 88 are analogous to the curving sections 122 and 124 of the interior chamber of the horn type musical instrument 100, and the rear opening 36 of the present invention speaker 10 is analogous to the outlet opening 126 of the horn type musical instrument 100. This unique design and construction of the multiple interconnected chambers provides an excellent backload amplifying function to the present invention center channel speaker 10. Because of the multiple interconnected backload amplifying chambers, the present invention center channel speaker 10 is able to produce very smooth and seamless, very open and airy lower frequency sound effects without adding additional low frequency drivers to the center channel speaker.

Referring to FIG. 9, there is shown a perspective view of a typical setup of a surround sound speaker system, including the present invention front-firing two-way multi-chamber backload amplifying center channel speaker 10, for home theater audio/video entertainment systems. The home entertainment system comprises a large screen TV set 132 and an audio/video rack 134 which includes a receiver 136. The receiver 136 has outputs for four surround sound channels including right front channel, left front channel, rear surround channel and center channel. The speaker system further comprises five speakers: a front-firing two-way multi-chamber backload amplifying center channel speaker 10, a right front speaker 142, a left front speaker 144 and two rear surround speakers 146 and 148. The center channel speaker 10 is placed on top of the large screen TV set 132.

The present invention speaker system works as follows. The center channel signals are sent from the receiver 136 to the center channel speaker 10, the right and left front channel signals are sent from the receiver 136 to the right and left front speakers 142 and 144 respectively, and the rear surround sound effects are sent from the receiver 136 to the two rear surround speakers 144 and 148. The center channel dialogue sound effects are produced by the tweeter 42 and the two midranges 44 and 46 of the center channel speaker 10. The backload of the midranges 44 and 46 are also amplified by the multiple interconnected chambers of the center channel speaker 10. The right and left front stereo sound effects are produced by the right and left front speakers 142 and 144 respectively, and the rear surround sound effects are produced by the two rear surround speakers 146 and 148.

The present invention speaker system has many advantageous features, including: (a) it provides superior sound effects in all four surround sound channels including the center channel through actual center channel drivers, rather than synthesizing the center channel sound effects by using the front speakers in a "phantom" mode; (b) the center channel speaker utilizes a multi-chamber cabinet for amplifying the backload of the front-firing drivers; (c) the cabinet of the center channel speaker has standard exterior dimensions so the center channel speaker can be suitably placed together with other audio/video components; and (d) it can provide deep and rich lower frequency dialogue sound effects without using an extra low frequency driver such as a subwoofer or woofer, thereby reducing the cost of the speaker system.

Defined in detail, the present invention is a speaker for an audio system having four stereo surround sound channels including a right front channel, a left front channel, a rear surround channel and a center channel, the speaker comprising: (a) a rectangular shaped cabinet made of wooden material, where the width of the cabinet is approximately 17 inches, the depth of the cabinet is approximately 18 inches and the height of the cabinet is approximately 5 inches; (b) said cabinet having a hollow interior and being assembled by six flat rectangular panels including a top panel, a bottom panel, a front panel, a rear panel and two opposite lateral side panels; (c) a 1 inch tweeter, a right 4½ inch midrange and a left 4½ inch midrange; (d) said front panel of said cabinet having a center opening, a right opening and a left opening all aligned longitudinally, where the diameter of the center opening is approximately 1 inch for accommodating said tweeter, the diameter of the right and left openings are each approximately 4½ inches for accommodating said right and left midranges respectively; (e) means for attaching said tweeter and said right and left midranges to said front panel of said cabinet; (f) a center channel crossover network attached to said bottom panel of said cabinet for connecting said tweeter and said right and left midranges with said center channel; (g) said cabinet further comprising a first interior partition panel and a second interior partition panel which are parallel to said front and rear end panels and divide the hollow interior of said cabinet into three interior chambers including a front chamber, a middle and a rear chamber, where the depth of the front chamber is approximately 3 inches, the depth of the middle chamber is approximately 6 inches and the depth of the rear chamber is approximately 9 inches; (h) said first interior partition panel having a generally rectangular shaped first interconnecting opening which interconnects said front chamber and said middle chamber, where the width of the first interconnecting opening is approximately 2 inches and the height of the first interconnecting opening is approximately 3.28 inches; (i) said second interior partition panel having a generally rectangular shaped second interconnecting opening which interconnects said middle chamber and said rear chamber, where the width of the second interconnecting opening is approximately 5.43 inches and the height of the second interconnecting opening is approximately 3.28 inches; (j) said rear panel of said cabinet having a generally rectangular shaped rear outlet opening, where the width of the rear outlet opening is approximately 8.8 inches and the height of the rear outlet opening is approximately 3.28 inches; and (k) said first and second interconnecting openings and said rear outlet opening all being alternatively offset for having said front, middle and rear chambers connected in series to form a continuous bass-reflex enclosure with gradually expanded volume; (l) whereby said tweeter and said right and left midranges produce high and mid-frequency dialogue sound effects of said center channel of said audio system, and said interconnected front, middle and rear chambers amplify lower frequency dialogue sound effects of said center channel of said audio system.

Defined broadly, the present invention is a speaker for an audio system having four stereo surround sound channels including a right front channel, a left front channel, a rear surround channel and a center channel, the speaker comprising: (a) a rectangular shaped cabinet made of wooden material having a top, a bottom, a front end, a rear end and two opposite lateral sides, the cabinet further having a hollow interior; (b) a tweeter, a right midrange and a left midrange; (c) said front end of said cabinet having a center opening, a right opening and a left opening for accommodating said tweeter, and said right and left midranges respectively; (d) means for attaching said tweeter and said right and left midranges to said front end of said cabinet; (e) a center channel crossover network installed on said cabinet for connecting said tweeter and said right and left midranges with said center channel; (f) said cabinet further comprising a first partition wall and a second partition wall which are parallel to said front and rear ends of said cabinet and divide the hollow interior of said cabinet into three chambers including a front chamber, a middle and a rear chamber, where the volume of said middle chamber is larger than the volume of the front chamber, and the volume of the rear chamber is larger than the volume of the middle chamber; (g) said first partition wall having a generally rectangular shaped first interconnecting opening which interconnects said front chamber and said middle chamber, said second partition wall having a generally rectangular shaped second interconnecting opening which interconnects said middle chamber and said rear chamber, where the area of the second interconnecting opening is larger than the area of the first interconnecting opening; (h) said rear end of said cabinet having a generally rectangular shaped rear outlet opening, where the area of the rear outlet opening is larger than the area of said second interconnecting opening; and (i) said first and second interconnecting openings and said rear outlet opening all being alternatively offset for having said front, middle and rear chambers connected in series to form a continuous bass-reflex enclosure with gradually expanded volume; (j) whereby said tweeter and said right and left midranges produce high and mid-frequency dialogue sound effects of said center channel of said audio system, and said interconnected front, middle and rear chambers amplify lower frequency dialogue sound effects of said center channel of said audio system.

Defined more broadly, the present invention is a speaker for an audio system having four stereo surround sound channels including a right front channel, a left front channel, a rear surround channel and a center channel, the speaker comprising: (a) a generally rectangular shaped cabinet having a top side, a bottom side, a front end, a rear end and two opposite lateral sides; (b) a high frequency driver, a right mid-frequency driver and a left mid-frequency driver; (c) said front end of said cabinet having a center opening to accommodate said high frequency driver, and a right opening and a left opening for accommodating said right and left mid-frequency drivers respectively; (d) means for installing said high frequency driver and said right and left mid-frequency drivers in said cabinet corresponding to said center opening and said right and left openings on said front end of said cabinet respectively; (e) a center channel crossover network installed on said cabinet for connecting said high frequency driver and said right and left mid-frequency drivers with said center channel; (f) said cabinet further comprising a multiplicity of hollow chambers including a front chamber, at least one interconnecting chamber and a rear chamber, where the volume of the at least one interconnecting chamber is larger than the volume of the front chamber, and the volume of the rear chamber is larger than the volume of the at least one interconnecting chamber; (g) said front and said at least one interconnecting chamber being interconnected by a first interconnecting opening, said at least one interconnecting chamber and said rear chamber being interconnected by a second interconnecting opening, where the area of the second interconnecting opening is larger than the area of the first interconnecting opening; (h) said rear end of said cabinet having a rear outlet opening, where the area of the rear outlet opening is larger than the area of said second interconnecting opening; and (i) said first and second interconnecting openings and said rear outlet opening all being alternatively offset for having said multiplicity of chambers connected in series to form a continuous bass-reflex enclosure with gradually expanded volume; (j) whereby said high-frequency driver and said right and left mid-frequency drivers produce high and mid-frequency dialogue sound effects of said center channel of said audio system, and said multiplicity of chambers amplify lower frequency dialogue sound effects of said center channel of said audio system.

Defined even more broadly, the present invention is a speaker for an audio system having four stereo surround sound channels including a right front channel, a left front channel, a rear surround channel and a center channel, the speaker comprising: (a) a cabinet having a multiplicity of hollow chambers interconnected in series; (b) at least one driver installed in the first one of said series of interconnected chambers; (c) a crossover network for connecting said at least one driver with said center channel; and (d) the last one of said series of interconnected chambers having a vent opened to the outside of said cabinet, which makes said series of interconnected chambers a bass-reflex enclosure; (e) whereby said at least one driver can produce sound effects of said center channel of said audio system, and said multiplicity of chambers amplify the backload of said at least one driver to produce lower frequency sound effects of said center channel of said audio system.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A speaker for an audio system having four stereo surround sound channels including a right front channel, a left front channel, a rear surround channel and a center channel, the speaker comprising:

a. a rectangular shaped cabinet made of wooden material having a top, a bottom, a front end, a rear end and two opposite lateral sides, the cabinet further having a hollow interior;

b. a tweeter, a right midrange and a left midrange;

c. said front end of said cabinet having a center opening, a right opening and a left opening for accommodating said tweeter, and said right and left midranges respectively;

d. means for attaching said tweeter and said right and left midranges to said front end of said cabinet;

e. a center channel crossover network installed on said cabinet for connecting said tweeter and said right and left midranges with said center channel;

f. said cabinet further comprising a first partition wall and a second partition wall which are parallel to said front and rear ends of said cabinet and divide said hollow interior of said cabinet into three chambers including a front chamber, a middle chamber and a rear chamber, where the volume of the middle chamber is larger than the volume of the front chamber, and the volume of the rear chamber is larger than the volume of the middle chamber such that the volumes of the front, middle and rear chambers are proportionally increased;

g. said first partition wall having a generally rectangular shaped first interconnecting opening which interconnects said front chamber and said middle chamber, said second partition wall having a generally rectangular shaped second interconnecting opening which interconnects said middle chamber and said rear chamber, where the area of the second interconnecting opening is larger than the area of the first interconnecting opening;

h. said rear end of said cabinet having a generally rectangular shaped rear outlet opening, where the area of the rear outlet opening is larger than the area of said second interconnecting opening such that the areas of said first and second interconnecting openings and the rear outlet opening are gradually increased; and i. said first and second interconnecting openings and said rear outlet opening all being alternatively offset respectively at opposite ends of said first partition wall, said second partition wall and said rear end of said cabinet for having said front, middle and rear chambers connected in series to form a continuous bass-reflex enclosure with gradually expanded volume;

j. whereby said tweeter and said right and left midranges produce high and mid-frequency dialogue sound effects of said center channel of said audio system, and said interconnected front, middle and rear chambers amplify lower frequency dialogue sound effects of said center channel of said audio system.

2. The invention as defined in claim 1 wherein the width of said cabinet is 17 inches, the depth of said cabinet is 18 inches and the height of said cabinet is 5 inches.

3. The invention as defined in claim 1 wherein the depth of said front chamber of said cabinet is 3 inches, the depth of said middle chamber of said cabinet is 6 inches, and the depth of said rear chamber of said cabinet is 9 inches.

4. The invention as defined in claim 1 wherein said tweeter is a 1 inch tweeter.

5. The invention as defined in claim 1 wherein said right and left midranges are both 4½ inch midranges.

6. The invention as defined in claim 4 wherein the diameter of said center opening on said front end of said cabinet for accommodating said 1 inch tweeter is 1 inch.

7. The invention as defined in claim 5 wherein the diameters of said right and left openings on said front end of said cabinet for accommodating said right and left midranges are both 4½ inches.

8. The invention as defined in claim 1 further comprising a generally rectangular shaped flat grill attachable to said front end of said cabinet for protecting said tweeter and said right and left midranges.

9. A speaker for an audio system having four stereo surround sound channels including a right front channel, a left front channel, a rear surround channel and a center channel, the speaker comprising:

a. a rectangular shaped cabinet made of wooden material, where the width of the cabinet is 17 inches, the depth of the cabinet is 18 inches and the height of the cabinet is 5 inches;

b. said cabinet having a hollow interior and being assembled by six flat rectangular panels including a top panel, a bottom panel, a front panel, a rear panel and two opposite lateral side panels;

c. a 1 inch tweeter, a right 4½ inch midrange and a left 4½ inch midrange;

d. said front panel of said cabinet having a center opening, a right opening and a left opening all aligned longitudinally, where the diameter of the center opening is 1 inch for accommodating said tweeter, the diameter of the right and left openings are each 4½ inches for accommodating said right and left midranges respectively;

e. means for attaching said tweeter and said right and left midranges to said front panel of said cabinet;

f. a center channel crossover network attached to said bottom panel of said cabinet for connecting said tweeter and said right and left midranges with said center channel;

g. said cabinet further comprising a first interior partition panel and a second interior partition panel which are parallel to said front and rear panels and divide said hollow interior of said cabinet into three interior chambers including a front chamber, a middle chamber and a rear chamber, where the depth of the front chamber is 3 inches, the depth of the middle chamber is 6 inches and the depth of the rear chamber is 9 inches such that the volumes of the front, middle and rear chambers are proportionally increased;

h. said first interior partition panel having a generally rectangular shaped first interconnecting opening which interconnects said front chamber and said middle chamber, where the width of the first interconnecting opening is 2 inches and the height of the first interconnecting opening is 3.28 inches;

i. said second interior partition panel having a generally rectangular shaped second interconnecting opening which interconnects said middle chamber and said rear chamber, where the width of the second interconnecting opening is 5.43 inches and the height of the second interconnecting opening is 3.28 inches;

j. said rear panel of said cabinet having a generally rectangular shaped rear outlet opening, where the width of the rear outlet opening is 8.8 inches and the height of the rear outlet opening is 3.28 inches such that the areas of said first and second interconnecting openings and the rear outlet opening are gradually increased; and k. said first and second interconnecting openings and said rear outlet opening all being alternatively offset respectively at opposite ends of said first interior partition panel, said second interior partition panel and said rear panel of said cabinet for having said front, middle and rear chambers connected in series to form a continuous bass-reflex enclosure with gradually expanded volume;

l. whereby said tweeter and said right and left midranges produce high and mid-frequency dialogue sound effects of said center channel of said audio system, and said interconnected front, middle and rear chambers amplify lower frequency dialogue sound effects of said center channel of said audio system.

10. The invention as defined in claim 9 further comprising a rectangular shaped flat grill attachable to said front panel of said cabinet for protecting said tweeter and said right and left midranges.

11. The invention as defined in claim 9 further comprising four standing members attachable to four corners of said bottom panel of said cabinet for elevating said cabinet.

12. A speaker for an audio system having four stereo surround sound channels including a right front channel, a left front channel, a rear surround channel and a center channel, the speaker comprising:

a. a generally rectangular shaped cabinet having a top side, a bottom side, a front end, a rear end and two opposite lateral sides;

b. a high frequency driver, a right mid-frequency driver and a left mid-frequency driver;

c. said front end of said cabinet having a center opening to accommodate said high frequency driver, and a right opening and a left opening for accommodating said right and left mid-frequency drivers respectively;

d. means for installing said high frequency driver and said right and left mid-frequency drivers in said cabinet corresponding to said center opening and said right and left openings on said front end of said cabinet respectively;

e. a center channel crossover network installed on said cabinet for connecting said high frequency driver and said right and left mid-frequency drivers with said center channel;

f. said cabinet further comprising a multiplicity of hollow chambers including a front chamber, at least one interconnecting chamber and a rear chamber, where the volume of the at least one interconnecting chamber is larger than the volume of the front chamber, and the volume of the rear chamber is larger than the volume of the at least one interconnecting chamber such that the volumes of the front and at least one interconnecting and rear chambers are proportionally increased;

g. said front chamber and said at least one interconnecting chamber being interconnected by a first interconnecting opening, said at least one interconnecting chamber and said rear chamber being interconnected by a second interconnecting opening, where the area of the second interconnecting opening is larger than the area of the first interconnecting opening;

h. said rear end of said cabinet having a rear outlet opening, where the area of the rear outlet opening is larger than the area of said second interconnecting opening such that the areas of said first and second interconnecting openings and the rear outlet opening are gradually increased; and i. said first and second interconnecting openings and said rear outlet opening all being alternatively offset respectively at opposite ends for having said multiplicity of chambers connected in series to form a continuous bass-reflex enclosure with gradually expanded volume;

j. whereby said high-frequency driver and said right and left mid-frequency drivers produce high and mid-frequency dialogue sound effects of said center channel of said audio system, and said multiplicity of chambers amplify lower frequency dialogue sound effects of said center channel of said audio system.

13. The invention as defined in claim 12 wherein the volume ratio of said front chamber, said at least one interconnecting chamber and said rear chamber is 1:2:3.

14. The invention as defined in claim 12 wherein said high frequency driver is a tweeter.

15. The invention as defined in claim 12 wherein said right and left mid-frequency drivers are both midranges.

16. The invention as defined in claim 12 wherein said right and left mid-frequency drivers are both fullranges.

17. The invention as defined in claim 12 further comprising a generally rectangular shaped grill attachable to said front end of said cabinet for protecting said high frequency driver and said right and left mid-frequency drivers.

18. A speaker for an audio system having four stereo surround sound channels including a right front channel, a left front channel, a rear surround channel and a center channel, the speaker comprising:

a. a cabinet having a multiplicity of hollow chambers interconnected in series such that the respective volumes of the series of interconnected chambers are proportionally increased;

b. at least one mid or full range frequency driver installed in the first one of said series of interconnected chambers;

c. a crossover network for connecting said at least one mid or full range frequency driver with said center channel; and d. the last one of said series of interconnected chambers having a vent opened to the outside of said cabinet, which makes said series of interconnected chambers a bass-reflex enclosure, the adjacent ones of said series of interconnected chambers are divided by a respective partition wall and interconnected by a respective interconnecting opening on the respective partition wall such that the areas of the interconnecting openings of said series of interconnected chambers are gradually increased;

e. whereby said at least one mid or full range frequency driver can produce sound effects of said center channel of said audio system, and said multiplicity of chambers amplify the backload of said at least one mid or full range frequency driver to produce lower frequency sound effects of said center channel of said audio system.

19. The invention as defined in claim 18 wherein said at least one mid or full range frequency driver is a midrange.

20. The invention as defined in claim 19 wherein said at least one mid or full range frequency driver is a full-range.

21. The invention as defined in claim 18 further comprising at least one tweeter installed in said first one of said series of interconnected chambers.

* * * * *